(12) United States Patent
Kilcoyne et al.

(10) Patent No.: US 12,051,712 B2
(45) Date of Patent: Jul. 30, 2024

(54) CLOSE BUTTED COLLOCATED VARIABLE TECHNOLOGY IMAGING ARRAYS ON A SINGLE ROIC

(71) Applicant: Raytheon Company, Waltham, MA (US)

(72) Inventors: Sean P. Kilcoyne, Lompoc, CA (US); George Grama, Orcutt, CA (US); Scott S. Miller, Buellton, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 18/317,376

(22) Filed: May 15, 2023

(65) Prior Publication Data
US 2023/0282665 A1    Sep. 7, 2023

Related U.S. Application Data

(62) Division of application No. 17/079,150, filed on Oct. 23, 2020, now Pat. No. 11,705,471.

(51) Int. Cl.
*H01L 27/146* (2006.01)
*H01L 23/00* (2006.01)

(52) U.S. Cl.
CPC ........ *H01L 27/14634* (2013.01); *H01L 24/16* (2013.01); *H01L 24/32* (2013.01); *H01L 24/83* (2013.01); *H01L 24/92* (2013.01); *H01L 27/14636* (2013.01); *H01L 27/1469* (2013.01); *H01L 2224/08145* (2013.01); *H01L 2224/16145* (2013.01); *H01L 2224/16146* (2013.01); *H01L 2224/16505* (2013.01); *H01L 2224/32145* (2013.01); *H01L 2224/80895* (2013.01); *H01L 2224/83896* (2013.01); *H01L 2224/9201* (2013.01); *H01L 2224/92143* (2013.01); *H01L 2224/92242* (2013.01)

(58) Field of Classification Search
None
See application file for complete search history.

(56) References Cited

U.S. PATENT DOCUMENTS

| | | |
|---|---|---|
| 9,100,545 B2 | 8/2015 | Vampola et al. |
| 9,571,765 B2 | 2/2017 | Guo et al. |
| 10,847,569 B2 | 11/2020 | Burkhart et al. |
| 2009/0078964 A1 | 3/2009 | Briere |
| 2010/0177224 A1 | 7/2010 | Vampola et al. |
| 2014/0110585 A1 | 4/2014 | Justice |

(Continued)

FOREIGN PATENT DOCUMENTS

WO    2018119239 A1    6/2018

OTHER PUBLICATIONS

Knight et al.; "Landsat-8 Operational Land Imager Design, Characterization and Performance"; Remote Sensing; ISSN 2072-4292; vol. 6; 2014; pp. 10286-10305.

(Continued)

*Primary Examiner* — Telly D Green
(74) *Attorney, Agent, or Firm* — CANTOR COLBURN LLP

(57) ABSTRACT

A semiconductor-based imaging device and method of manufacture. A direct bond hybridization (DBH) structure is formed on a top surface of a read out integrated circuit (ROIC). A silicon-based detector is bonded to the ROIC via the DBH structure. A non-silicon-based detector is bonded to the DBH structure located on the top of the ROIC using indium-based hybridization.

12 Claims, 4 Drawing Sheets

(56) References Cited

U.S. PATENT DOCUMENTS

| | | |
|---|---|---|
| 2015/0163401 A1 | 6/2015 | Botts et al. |
| 2018/0190705 A1 | 7/2018 | Kilcoyne et al. |
| 2018/0199871 A1 | 7/2018 | Pauley et al. |
| 2018/0301365 A1 | 10/2018 | Kilcoyne et al. |
| 2020/0273893 A1 | 8/2020 | Burkhart et al. |
| 2021/0043665 A1 | 2/2021 | Burkhart et al. |
| 2021/0210455 A1 | 7/2021 | Getty et al. |
| 2021/0227158 A1 | 7/2021 | Kennedy et al. |
| 2022/0052020 A1 | 2/2022 | Sonde et al. |
| 2022/0130883 A1 | 4/2022 | Kilcoyne et al. |
| 2022/0136899 A1 | 5/2022 | Arbore et al. |

OTHER PUBLICATIONS

Levy et al.; "Landsat 8 Operational Land Imager (OLI) Detector-to-Detector Uniformity Challenge and Performance"; Proceedings of SPIE; vol. 9218; Oct. 2, 2014; 12 Pages.

Russell; "Highlighting Raytheon's Engineering & Technology Innovations"; Technology Today; Issue 2, 2019; 37 Pages.

Starr et al.; "RVS Large Format Arrays for Astronomy"; Proceedings of SPIE; vol. 9915; 2016; 15 Pages.

Storey et al.; "Landsat 8 Operational Land Imager On-Orbit Geometric Calibration and Performance"; Remote Sensing; ISSN 2072-4292; vol. 6; 2014; pp. 11127-11152.

CLOSE BUTTED COLLOCATED VARIABLE TECHNOLOGY IMAGING ARRAYS ON A SINGLE ROIC

CROSS-REFERENCE TO RELATED APPLICATIONS

This application is a division of U.S. application Ser. No. 17/079,150 filed Oct. 23, 2020, the disclosure of which is incorporated herein by reference in its entirety.

BACKGROUND

The present disclosure relates to semiconductor-based imaging arrays and, in particular, to an imaging device using silicon and non-silicon imaging detectors and methods for manufacture.

Remote sensing and tactical applications use semiconductor-based imaging devices or detectors due to their light weight, small size, and efficiency. These imaging devices typically are in the form of a sensor chip assembly (SCA) including a silicon-based read out integrated circuit (ROIC). The ROIC can support multiple semiconductor detectors such as visible light band detectors and infrared (IR) band detectors. Visible light band detectors are often made of silicon, while IR band detectors are made of non-silicon materials, such as MCT (HgCdTe—Mercury Cadmium Telluride), InGaAs (Indium Gallium Arsenide), InSb (Indium Antimonide), GaSb (Gallium Antimonide), etc.

The SCA can be formed by bonding the detector to the ROIC, typically through a process known as indium bump hybridization. The indium interconnect enables a compliant interconnection that allows the detectors to expand and/or contract with temperature changes without breaking the interconnection, even as detectors and ROIC have different coefficients of thermal expansion.

An SCA can be formed to image at to different wavelengths by bonding two detectors responsive to different bands, such as visible detectors and IR detectors, to the ROIC. Historically, the visible detector and infrared detector are attached using the indium-based hybridization process. This approach has two shortcomings. First of all, Indium-based hybridization limits the yield of the visible imager, due to the process limitations. Secondly, the indium hybrid process can limit the spacing between the visible and the infrared imagers.

SUMMARY

According to one embodiment of the present disclosure, a semiconductor-based imaging device is disclosed. The semiconductor-based imaging device includes a silicon-based support structure, a first detector formed on a silicon layer, a second detector formed on a non-silicon layer, and a direct bond hybridization (DBH) structure between the support structure and the silicon layer of the first detector and between the support structure and the non-silicon layer of the second detector.

According to another embodiment of the present disclosure an imaging device is disclosed. The imaging device includes a silicon-based read out integrated circuit (ROIC), a first detector formed on a silicon layer, a second detector formed on a non-silicon layer, and a direct bond hybridization (DBH) structure between the ROIC and the first detector and the second detector.

According to yet another embodiment of the present disclosure, a method of manufacturing an imaging device is disclosed. The method includes forming a direct bond hybridization (DBH) structure on a top surface of a read out integrated circuit (ROIC), bonding a silicon-based detector to the ROIC via the DBH structure, and bonding a non-silicon-based detector to the DBH structure located on the top of the ROIC using indium-based hybridization.

Additional features and advantages are realized through the techniques of the present disclosure. Other embodiments and aspects of the disclosure are described in detail herein and are considered a part of the claimed disclosure. For a better understanding of the disclosure with the advantages and the features, refer to the description and to the drawings.

BRIEF DESCRIPTION OF THE SEVERAL VIEWS OF THE DRAWINGS

The subject matter which is regarded as the disclosure is particularly pointed out and distinctly claimed in the claims at the conclusion of the specification. The forgoing and other features, and advantages of the disclosure are apparent from the following detailed description taken in conjunction with the accompanying drawings in which:

DETAILED DESCRIPTION

Figure 1:
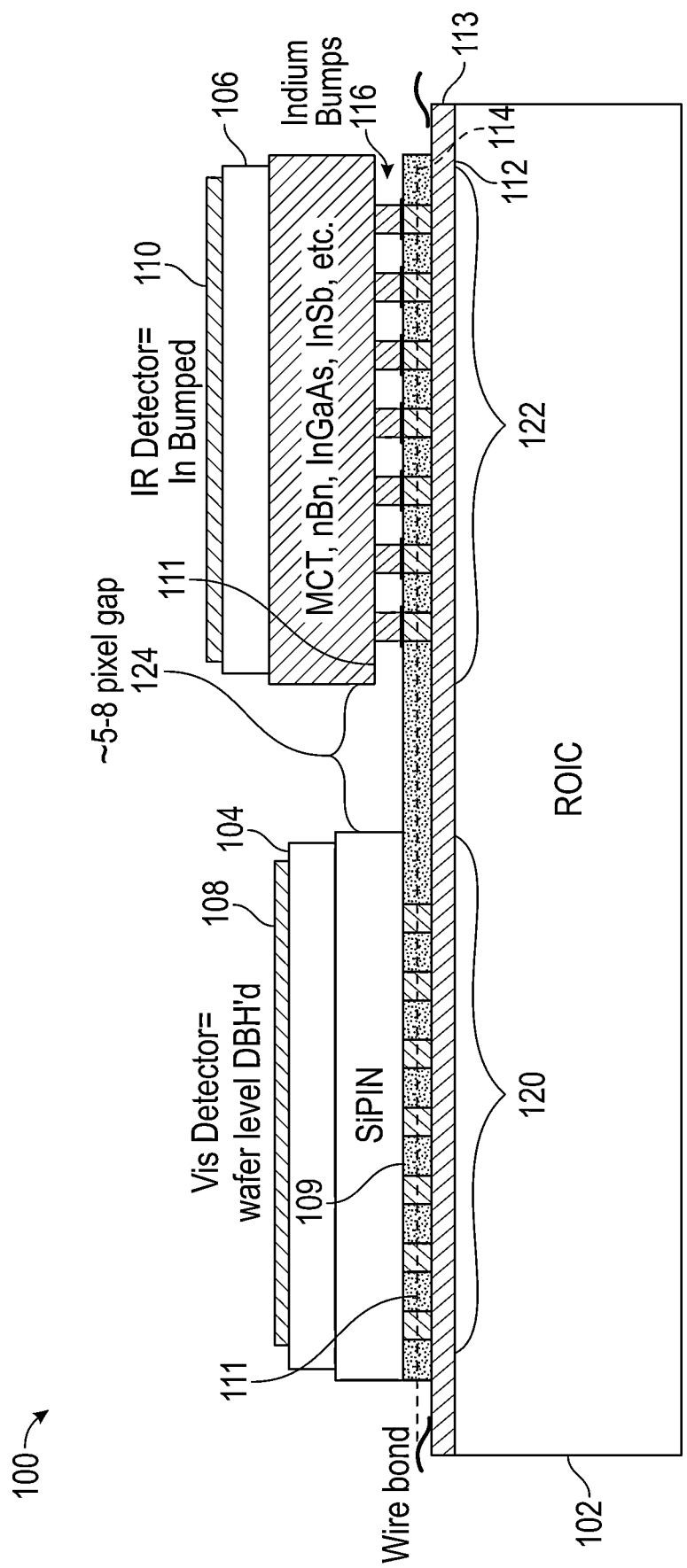
FIG. 1 shows a semiconductor-based imaging device in an illustrative embodiment.

FIG. 1 shows a semiconductor-based imaging device 100 in an illustrative embodiment. The semiconductor-based imaging device 100 can be used in any suitable imaging system, including a satellite imaging system, for example. The semiconductor-based imaging device 100 includes a silicon-based support structure such as a read out integrated circuit (ROIC) 102, a first detector 104 coupled to or bonded to the ROIC 102 and a second detector 106 coupled to or bonded to the ROIC 102. The first detector 104 and the second detector 106 can be semiconductor-based devices. The first detector 104 includes an anti-reflection coating 108 to increase a quantum efficiency of the first detector 104. Similarly, the second detector 106 includes an anti-reflection coating 110. In an embodiment, the first detector 104 is a visible light band detector and the second detector 106 is an infrared band detector. The ROIC 102 receives signals from each of the first detector 104 and the second detector 106 and transmits these signals to a processing circuit (not shown). A bonding surface 113 on an interlayer dielectric 112 of the ROIC 102 separates various ROIC interconnects of the ROIC 102 from each other.

In an embodiment, the ROIC 102 is a silicon-based device, such that at least an interlayer dielectric 112 of the ROIC 102 is made of silicon or silicon alloy (SiO2, SiN$_x$, etc.). A bonding surface 113 is formed on the interlayer dielectric 112. The first detector 104 is a silicon-based detector. In various embodiments, the first detector 104 is formed on a silicon layer, such as a Silicon P-I-N photodiode (SiPIN) layer. The silicon layer includes a bonding surface 109. The silicon layer is bonded to the ROIC 102 at a first bonding location 120 using a direct bond hybridization (DBH) process at the bonding surface 109, as indicated by DBH structure 114. The DBH structure 114 is prepared on the bonding surface 112 of the ROIC 102, prior to either detector being attached. A detector-based DBH structure 111 is also formed on the bonding surface 109 of the silicon layer of the first detector 104. The detector-based DBH structure 111 is bonded to the DBH structure 114 at the first bonding location 120 to bond the first detector 104 to the ROIC 102. The DBH process bonds ROIC interconnects from the ROIC 102 to corresponding silicon interconnects of the first detector 104. The DBH structure 114 is between the first detector 104 and the ROIC 102 and bonds the silicon layer of the first detector 104 to the ROIC 102 through the bonding surface 113 thereby providing electrical connections between first detector 104 and ROIC 102.

The second detector 106 is a non-silicon-based detector. In various embodiments, the second detector 106 is formed on a non-silicon layer such as an MCT (Mercury Cadmium Telluride) layer, an Indium Phosphide layer, a Gallium Antimonide layer, an Indium Gallium Arsenide (InGaAs) layer, an Indium Antimonide (InSb) layer, etc. In various embodiments, the non-silicon layer can be in the form of a strained layer superlattice. The non-silicon layer is bonded to the ROIC 102 at a second bonding location 122 through the DBH structure 114 using an indium-based hybridization process. To bond the second detector 106, an indium bump layer 116 is formed on the DBH structure 114 at the second bonding location 122. The indium bumps are bonded to corresponding ROIC interconnects of the ROIC 102 via an indium hybridization process. Contacts for pixel connections are made on surface 111 of the non-silicon layer of the second detector 106 is then bonded to the indium bump layer 116 using a process such as flip chip bonding. The DBH structure 114 is therefore between the indium bump layer 116 and the ROIC 102.

The DBH structure 114 extends from the first bonding location 120 to the second bonding location 122. The use of the DBH structure 114 for both the first detector 104 and the second detector 106 allows the first detector 104 and the second detector 106 to be placed in close proximity to each other, overcoming difficulties inherent in legacy processing which result in large spacing between detectors due to the challenge of performing indium bump photolithography processing next to an indium based hybrid. A gap 124 between the first detector 104 and the second detector 106 can be reduced to less than about 1 to 2 pixels, which each pixel is about 8 to 12 microns in length. Therefore, the gap 124 is in a range of about 8 microns to about 24 microns.

In addition, due to use of DBH bonding methods, the first detector 104 is located at a first Z-height above the bonding surface 113 of the ROIC 102 and the second detector 106 is located at a second Z-height above the bonding surface 113 of the ROIC 102. Using of the DBH process on both the first detector 104 and second detector 106 reduces a difference between the first Z-height and the second Z-height in comparison to a bonding method which uses DBH to bond the first detector 104 to the ROIC 102 and indium bumps bonding to bond the second detector 106 to the ROIC 102. In various embodiment, the first Z-height can be made the same as the second Z-height. Alternatively, the second Z-height is greater than the first Z-height.

Figure 2:
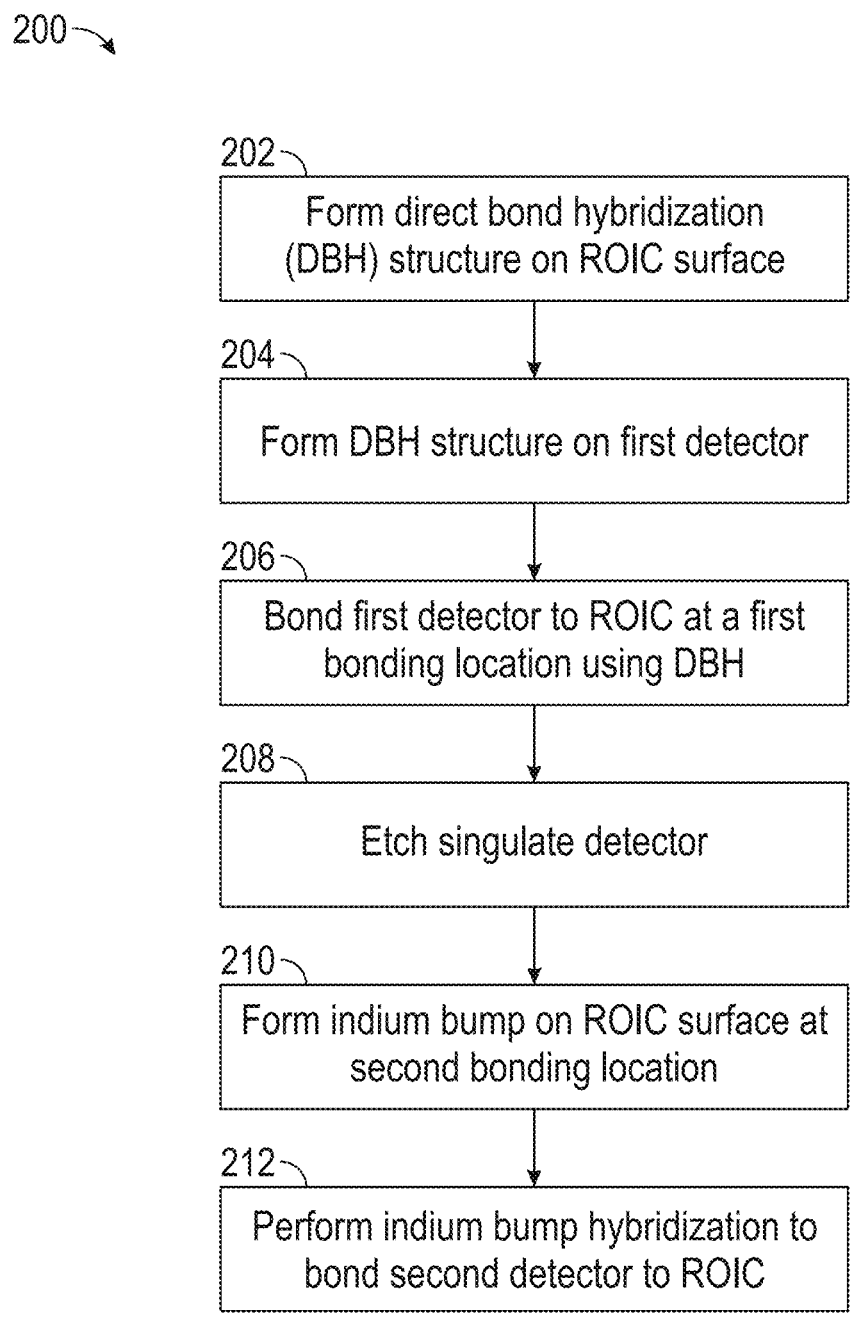
FIG. 2 shows a flowchart illustrating a method of manufacturing the semiconductor-based imaging device of FIG. 1.

FIG. 2 shows a flowchart 200 illustrating a method of manufacturing the semiconductor-based imaging device 100 of FIG. 1. In box 202, a DBH structure is applied to a bonding surface of the ROIC 102 with interconnects located above a first bonding location 120 for the first detector 104 (e.g., visible detector) and above a second bonding location 122 for the second detector 106 (e.g., IR detector). The DBH structure 114 is prepared over the bonding surface 113 of the ROIC 102, prior to either detector being attached. In box 204, a DBH structure is applied to a bonding surface of the visible detector. In box 206, the first detector 104 is bonded to the ROIC 102 using a DBH process. In box 208, the silicon layer of the first detector 104 is etched away outside of first bonding location 120. In box 210, indium bumps are formed on the DBH structure 114 at the second bonding location 122. In box 212, the indium bump hybridization process is performed to bond the non-silicon layer of the second detector 106 to the ROIC 102 using the indium bumps.

Figure 3:
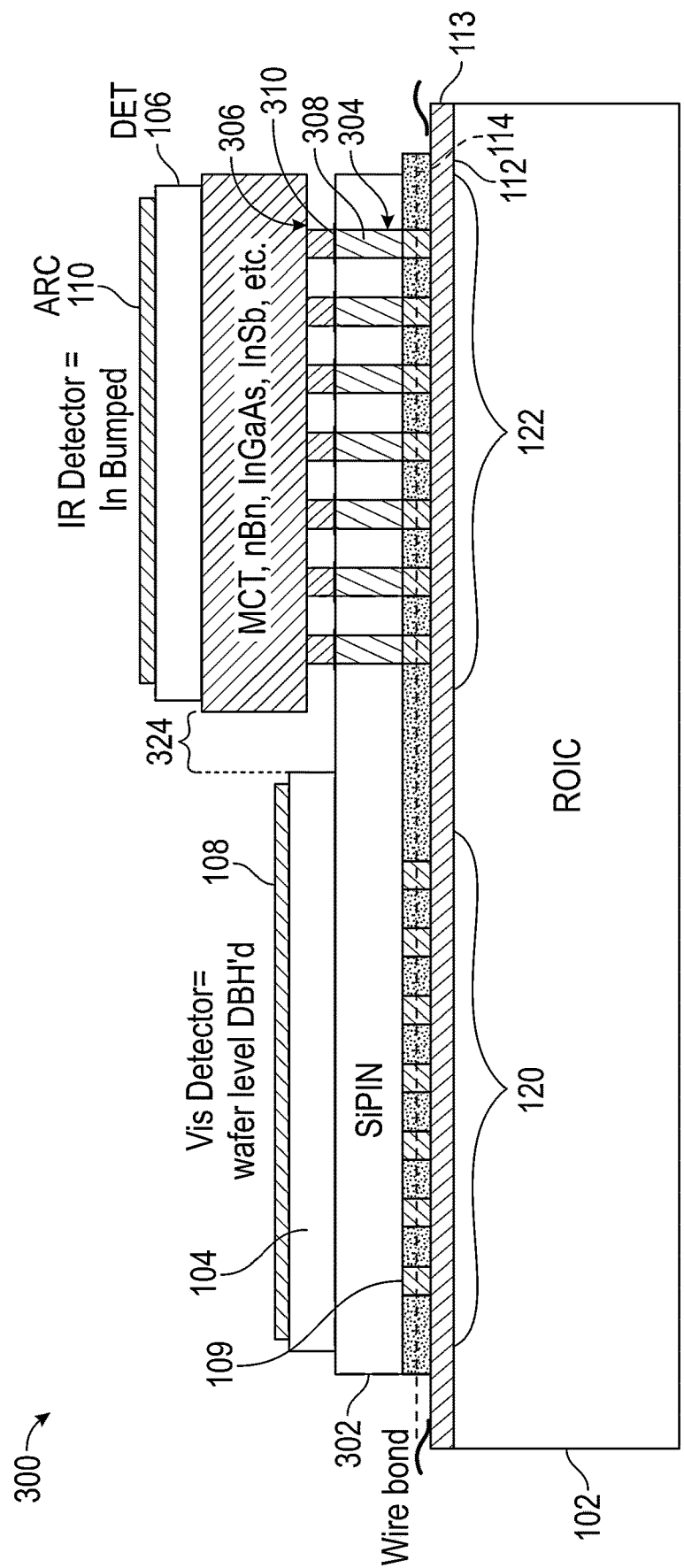
FIG. 3 shows a semiconductor-based imaging device in an alternate embodiment.

FIG. 3 shows a semiconductor-based imaging device 300 in an alternate embodiment. The semiconductor-based imaging device 300 includes the read out integrated circuit (ROIC) 102, the first detector 104 and the second detector 106. The first detector 104 is made of a silicon material forming a silicon layer 302, such as a Silicon P-I-N photodiode (SiPIN) layer. This silicon layer 302 serves two purposes in the semiconductor-based imaging device 300. First of all, the silicon layer 302 also forms a silicon landing area for the second detector 106. The silicon layer 302 is bonded to the ROIC 102 using direct bond hybridization (DBH) methods, which is indicated by DBH structure 114. A bonding surface 113 is between a top surface of the ROIC 102 (i.e., the interlayer dielectric 112) and the DBH structure 114, which contains embedded metal interconnects. The silicon layer 302 and bonding surface 113 both extend across the ROIC 102 from the first bonding location 120 to the second bonding location 122 across a gap 324. At the first bonding location 120, a DBH process is used to bond ROIC interconnects from the ROIC 102 to corresponding silicon interconnects of the silicon layer 302 through the bonding surface 113. At the second bonding location 122, a plurality of through silicon vias (TSVs) 304 are formed in the silicon layer 302. The TSVs 304 enable electrical interconnection to interconnects of the ROIC 102. The TSVs 304 are formed using copper, in one embodiment.

An indium bump layer 306 is formed on top of the silicon layer 302 above the TSVs 304, to form an interconnect to the corresponding non-silicon interconnect of the second detector 106. A TSV 304 electrically connects an indium bump of the indium bump layer 306 to the DBH structure 114. A first end 308 of the TSV 304 is bonded to the DBH structure 114 using the DBH process. The indium bump is formed on a second end 310 of the TSV 304. The second detector 106 is then bonded to the TSV 304 using an indium bump bonding process.

In an embodiment using the TSVs, 304, the gap 324 between the first detector 104 and second detector 106 can be made smaller that the gap 124 for the semiconductor-based imaging device 100 of FIG. 1. In various, embodiments, the gap 324 of FIG. 3 can be reduced to zero, i.e., no gap between the first detector 104 and the second detector 106. The difference between the Z-height of the first detector 104 and the Z-height of the second detector 106 in FIG. 3 is greater than in the Z-height difference in FIG. 1.

Figure 4:
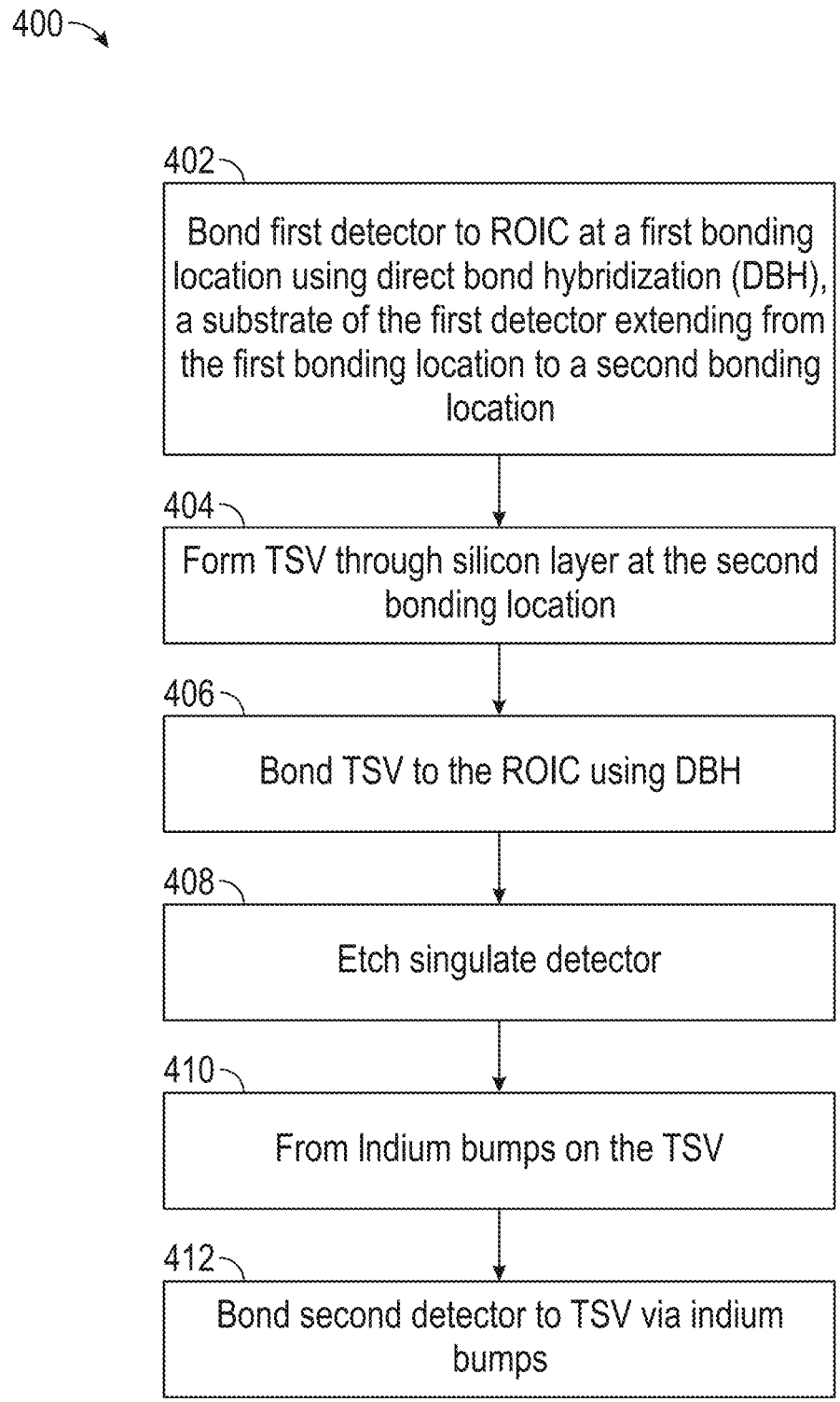
FIG. 4 shows a flowchart illustrating a method of manufacturing the semiconductor-based imaging device of FIG. 3.

FIG. 4 shows a flowchart 400 illustrating a method of manufacturing the semiconductor-based imaging device 300 of FIG. 3. In box 402, a silicon layer 302 of the first detector 104 (e.g., the silicon-based visible band detector) is bonded to the ROIC 102 at a first bonding location 120 using a DBH process. The silicon layer 302 extends from the first bonding location 120 to the second bonding location 122. In box 404, through-silicon vias (TSVs) are formed in the silicon layer 302 at the second bonding location 122. In box 406, the TSVs are bonded to the ROIC 102 via the DBH structure 114. In box 408, the silicon layer 302 is etched to form an island of silicon that separates first detector 104 and from the TSVs 304 of the second detector 106, which reveals the wire bond pads for use. In box 410, indium bumps are applied to the TSVs 304 in the silicon layer 302 at the second bonding location 122. In box 412, the second detector 106 is bonded to the TSVs 304 using indium bump bonding.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the form as disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for exemplary embodiments with various modifications as are suited to the particular use contemplated.

While the exemplary embodiment to the disclosure has been described, it will be understood that those skilled in the art, both now and in the future, may make various improvements and enhancements which fall within the scope of the claims which follow. These claims should be construed to maintain the proper protection for the disclosure first described.

What is claimed is:

1. A method of manufacturing an imaging device, comprising:
    forming a first direct bond hybridization (DBH) structure on a bonding surface of a read out integrated circuit (ROIC) to extend from a first bonding location to a second bonding location;
    forming a first detector on a silicon layer;
    bonding the first detector to the ROIC via a second DBH structure between the silicon layer and the first DBH structure at the first bonding location;
    forming a second detector on a non-silicon layer;
    bonding the second detector to the ROIC via an indium-bump layer between the non-silicon layer and the first DBH structure at the second bonding location.

2. The method of claim 1, further comprising forming the silicon layer of the first detector to extend from the first bonding location to the second bonding location and forming a through-silicon via through the silicon layer at the second bonding location.

3. The method of claim 1, further comprising bonding the first detector to the ROIC and bonding the second detector to the ROIC with a gap between the first detector and the second detect between about 8 microns and about 24 microns.

4. The method of claim 1, further comprising bonding the first detector to the ROIC to have a first Z-height above the ROIC and bonding the second detector to the ROIC to have a second Z-height above the ROIC that is the same as the first Z-height.

5. The method of claim 1, wherein the first detector is a visible light band detector and the second detector is an infrared band detector.

6. The method of claim 1, wherein the non-silicon layer includes at least one of: (i) Mercury Cadmium Telluride; (ii) Indium Phosphide; (iii) Gallium Antimonide; (iv) Indium Gallium Arsenide; (v) Indium Antimonide; and (vi) a strained layer superlattice.

7. A method of manufacturing an imaging device, comprising:
    forming a first direct bond hybridization (DBH) structure on a bonding surface of a silicon-based support structure to extend from a first bonding location to a second bonding location;
    forming a first detector on a silicon layer;
    bonding the first detector to the silicon-based support structure via a second DBH structure between the silicon layer and the first DBH structure at the first bonding location;
    forming a second detector on a non-silicon layer;
    bonding the second detector to the silicon-based support structure via an indium-bump layer between the non-silicon layer and the first DBH structure at the second bonding location.

8. The method of claim 7, further comprising forming the silicon layer of the first detector to extend from the first bonding location to the second bonding location and forming a through-silicon via through the silicon layer at the second bonding location.

9. The method of claim 7, further comprising bonding the first detector to the silicon-based support structure and bonding the second detector to the silicon-based support structure with a gap between the first detector and the second detect between about 8 microns and about 24 microns.

10. The method of claim 7, further comprising bonding the first detector to the silicon-based support structure to have a first Z-height above the silicon-based support structure and bonding the second detector to the silicon-based support structure to have a second Z-height above the silicon-based support structure that is the same as the first Z-height.

11. The method of claim 7, wherein the first detector is a visible light band detector and the second detector is an infrared band detector.

12. The method of claim 7, wherein the non-silicon layer includes at least one of: (i) Mercury Cadmium Telluride; (ii) Indium Phosphide; (iii) Gallium Antimonide; (iv) Indium Gallium Arsenide; (v) Indium Antimonide; and (vi) a strained layer superlattice.

\* \* \* \* \*